(12) United States Patent
Toft et al.

(10) Patent No.: US 12,156,003 B2
(45) Date of Patent: Nov. 26, 2024

(54) MICROPHONE ASSEMBLY WITH DISTURBANCE COMPENSATION

(71) Applicant: Knowles Electronics, LLC, Itasca, IL (US)

(72) Inventors: Jakob Kenn Toft, København (DK); Mohammad Shajaan, Copenhagen (DK); Claus Erdmann Fürst, Roskilde (DK)

(73) Assignee: Knowles Electronics, LLC, Itasca, IL (US)

(*) Notice: Subject to any disclaimer, the term of this patent is extended or adjusted under 35 U.S.C. 154(b) by 139 days.

(21) Appl. No.: 17/960,692

(22) Filed: Oct. 5, 2022

(65) Prior Publication Data
US 2023/0112042 A1 Apr. 13, 2023

Related U.S. Application Data

(60) Provisional application No. 63/253,877, filed on Oct. 8, 2021.

(51) Int. Cl.
| | |
|---|---|
| *H04R 3/02* | (2006.01) |
| *B81B 3/00* | (2006.01) |
| *B81B 7/00* | (2006.01) |
| *H02M 3/07* | (2006.01) |
| *H04R 1/04* | (2006.01) |

(Continued)

(52) U.S. Cl.
CPC ............ *H04R 3/02* (2013.01); *B81B 3/0056* (2013.01); *B81B 7/0064* (2013.01); *H02M 3/07* (2013.01); *H04R 1/04* (2013.01); *H04R 3/04* (2013.01); *H04R 19/04* (2013.01); *B81B 2201/0257* (2013.01); *B81B 2203/0127* (2013.01); *B81B 2203/04* (2013.01); *B81B 2207/03* (2013.01); *H04R 7/04* (2013.01); *H04R 2201/003* (2013.01)

(58) Field of Classification Search
CPC ... H04R 3/02; H04R 1/04; H04R 3/04; H04R 19/04; H04R 7/04; H04R 2201/003; H04R 19/00; H04R 3/06; B81B 3/0056; B81B 7/0064; B81B 2201/0257; B81B 2203/0127; B81B 2203/04; B81B 2207/03; H02M 3/07; H02M 1/0045
See application file for complete search history.

(56) References Cited

U.S. PATENT DOCUMENTS

| | | | | |
|---|---|---|---|---|
| 9,287,839 | B1 * | 3/2016 | Amadi | H03F 3/45659 |
| 2012/0308052 | A1 * | 12/2012 | Agarwal | H04R 3/00 |
| | | | | 381/122 |
| 2015/0256941 | A1 * | 9/2015 | Bymaster | H04R 25/30 |
| | | | | 381/323 |

FOREIGN PATENT DOCUMENTS

FR 2983949 A1 * 6/2013 ........... G01D 3/0365

* cited by examiner

*Primary Examiner* — Oyesola C Ojo
(74) *Attorney, Agent, or Firm* — Hickman Becker Bingham Ledesma LLP; Matthew C. Loppnow

(57) ABSTRACT

The present disclosure relates to a transducer assembly including a transducer having a movable member, and a servo-loop controller configured to compensate for effects of a disturbance on the transducer assembly by adjusting a bias voltage applied to the transducer. A servo-loop controller having a smaller bandwidth for out-of-band disturbances than for in-band disturbances and configured to control the bias voltage based on a feedback signal generated by a sensor that detects an effect of the disturbance on the transducer assembly. The transducer assembly can be implemented as a microphone or a speaker among other sensors and actuators.

20 Claims, 15 Drawing Sheets

(51) Int. Cl.
*H04R 3/04* (2006.01)
*H04R 7/04* (2006.01)
*H04R 19/04* (2006.01)

MICROPHONE ASSEMBLY WITH DISTURBANCE COMPENSATION

FIELD OF THE DISCLOSURE

The present disclosure relates generally to microphone assemblies and other devices comprising a transduction element, and more particularly to sensors and actuators and electrical circuits that suppress effects of disturbances on the performance thereof, and methods therein.

BACKGROUND

Transducer assemblies including a Microelectromechanical systems (MEMS) motor are increasingly used in all manner of applications for their small size, low cost, reasonably high sensitivity and signal-to-noise ratio (SNR), and the ability to readily integrate them in host devices and systems. One such application is a sensor for detecting sound in wireless handsets, laptop computers, smart speakers, wireless earphones, headsets, appliances and automobiles, among a variety of other consumer and industrial goods and machinery. It is generally desirable for these and other sensors to have high sensitivity over a desired frequency range (bandwidth) to achieve a high signal-to-noise ratio (SNR). MEMS motors are known to include a vent to compensate for changes in ambient pressure caused by weather systems, elevator rides, ingress to and from pressurized buildings, etc. The vent constitutes an acoustic filter and is sized to suppress select out-of-band frequencies that can overload the sensor or otherwise interfere with the desired bandwidth. However some next generation transducers may not include a vent and are thus susceptible to interference from out-of-band frequencies. Moreover some frequency content (e.g., from wind and other noise sources, etc.) within the desired bandwidth can adversely affect performance of sensors comprising transducers with or without a vent. Thus it is generally desirable to suppress in-band and out-of-band frequency content that can overload the transducer assembly or otherwise interfere with the desired bandwidth.

BRIEF DESCRIPTION OF THE DRAWINGS

The objects, features and advantages of the present disclosure will become more fully apparent from the following detailed description and the appended claims considered in conjunction with the accompanying drawings. The drawings depict only representative embodiments and are therefore not considered to limit the scope of the disclosure.

Figure 1:
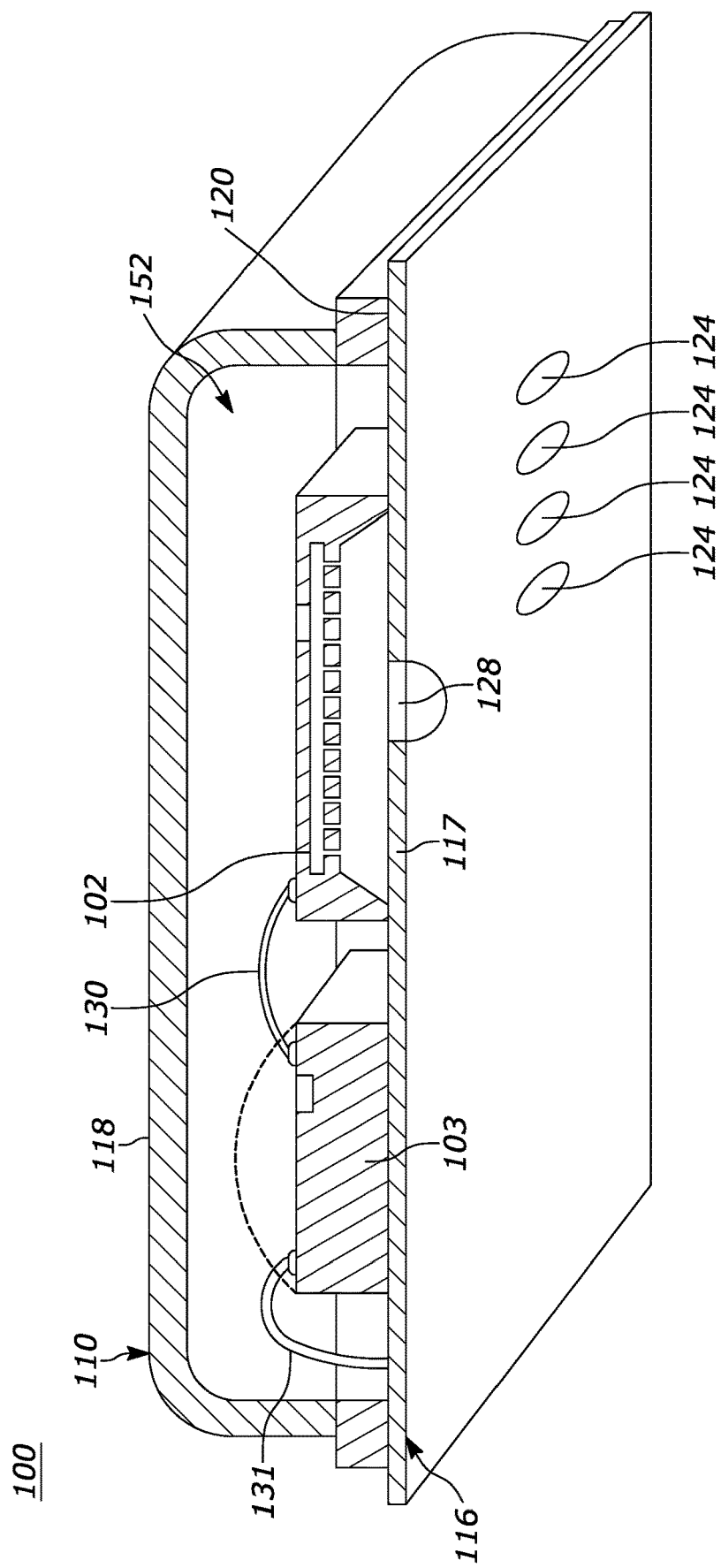
FIG. 1 is a sectional view of a representative transducer assembly.

Those of ordinary skill in the art will appreciate that the drawings are illustrated for simplicity and clarity and therefore may not be drawn to scale and may not include well-known features, that the order of occurrence of actions or steps may be different than the order described or may be performed concurrently unless specified otherwise, and that the terms and expressions used herein have the meaning understood by those of ordinary skill in the art except where different meanings are attributed to them herein.

DETAILED DESCRIPTION

The present disclosure relates to transducer assemblies comprising a transduction element (also referred to herein as a "transducer") coupled to an electrical circuit. The transducer assembly can be implemented as a sensor like a microphone or as an actuator, like a speaker. In an actuator the transduction element is configured to produce a mechanical output in response to an excitation signal. In a sensor, the transduction element is configured to produce an electrical signal in response to detecting a changing physical condition like pressure, acceleration, humidity, temperature, etc. The disclosure also relates to electrical circuits for such transducers assemblies, and methods therein.

The electrical circuit generally comprises a servo-loop controller configured to compensate for adverse effects of a disturbance acting on the transducer assembly. The disturbance can include frequency content outside or within a desired bandwidth of the transducer assembly. Such disturbances often include low frequency content. The disturbances can have a long or relatively short duration. One such disturbance is barometric pressure and changes therein. Other disturbances include wind noise and changes in ambient pressure caused by door slams, elevator rides, shock impacts, and random accelerations, among others. Such disturbances can adversely affect the performance of the transducer assembly by interfering with frequency content in the desired bandwidth, saturating a signal processing circuit of the transducer assembly, or by displacing a movable member of the transducer from a reference position. The reference position can be a bias or rest position of the movable member selected for optimal performance of the transducer or for other reasons. The term "position" herein refers to absolute position, a change in position (i.e., displacement), or both.

The servo-loop controller regulates a bias voltage applied to the transducer based on a feedback signal produced by a sensor in response to the disturbance, the effects of which are detectable by a sensor. The servo-loop controller can selectively suppresses frequency content (e.g., in-band or out-of-band) associated with the disturbance and re-position the moveable member relative to a reference position for optimal performance or other purposes. A bandwidth of the servo-loop can also be adapted to increase or decrease settling time based on a characteristic of the disturbance. These and other aspects of the disclosure are described more fully herein.

FIG. 1 is a cross-sectional view of a representative transducer assembly 100 comprising a transduction element configured as a MEMS motor, such as the transducer 102, coupled to an electrical circuit 103 disposed within a housing 110. The electrical circuit can be implemented as one or more integrated circuits, e.g., ASICS. The housing can include a base 116 and a cover 118 fastened to an upper surface 120 thereof. In some implementations, the housing shields the transduction element and the electrical circuit located within the interior 152 of the housing from electromagnetic interference, like RF noise, external to the housing. For this purpose, the cover can be metal. Alternatively, the cover can be a non-conductive material like plastic or FR4 comprising a conductive film or other conductive layer electrically coupled to a conductive portion (e.g., a ground plane) of the base. The housing can also include an external interface with contacts (e.g., supply, ground, data, clock, select, etc.) configured to interface with a host or other device. The external interface can be configured for reflow soldering, through-hole mounting or wire-bonding, among other known and future integration processes. In FIG. 1, the transducer assembly is a surface-mount device comprising a host-interface including electrical contacts 124 (e.g., GRND, PWR, Data, CLK, Select . . . ) located on an outer surface 117 of the base 116. The electrical circuit 103 is coupled to the transducer 102 via lead 130 and to contacts on the host-interface via leads 131 electrically connected to traces (not shown) in the base for this purpose. The electrical circuit can obtain power, clock and other signals from the contacts on the host-interface. Other transducer assemblies can be configured differently depending on the function performed and the use case.

In one embodiment, the transducer assembly is a microphone configured to produce an electrical signal representative of acoustic signals propagated through the atmosphere and detected by the transducer within the housing. In microphones and possibly other sensor assemblies the housing can include an aperture (also referred to herein as a "sound port" or "port") connecting the interior of the housing to the external environment. In FIG. 1, the port 128 is located on the base 116 in alignment with the transducer 102. In other transducer assemblies, the port can be on some other part of the housing. In top-port microphone assemblies, the sound port is located on the cover. In others, the port can be located on a side portion of the assembly.

In other embodiments, the transducer assembly is configured to generate an electrical signal representative of vibrations or forces detected by the transducer. For example, the transducer assembly can be configured to detect acoustic vibrations that propagate through an animate (e.g., a person) or an inanimate object. The acoustic vibration sensor can also be used in combination with a microphone that detects acoustic signals propagated through the air. Other transducer assemblies can be configured to detect pressure, acceleration, humidity, or temperature, among other conditions alone or in combination with sound or vibration. A sound port may not be required in other sensor assemblies, like acoustic vibration sensors and accelerometers, among others. In other implementations, the transducer assembly can be a sound-producing speaker or other actuator that responds to an electrical excitation signal.

The transducer assembly generally comprises a desired bandwidth depending on its type, configuration and use case. For example, microphone sensors are typically have a desired bandwidth in the human audible range, between roughly 20 Hz and 20 kHz or higher. The desired bandwidth of ultrasonic transducers can extend above and beyond the audible range, and the desired bandwidth of vibration sensors typically extends below the audible range. Other transducer assemblies can have other desired bandwidths.

Figure 2:
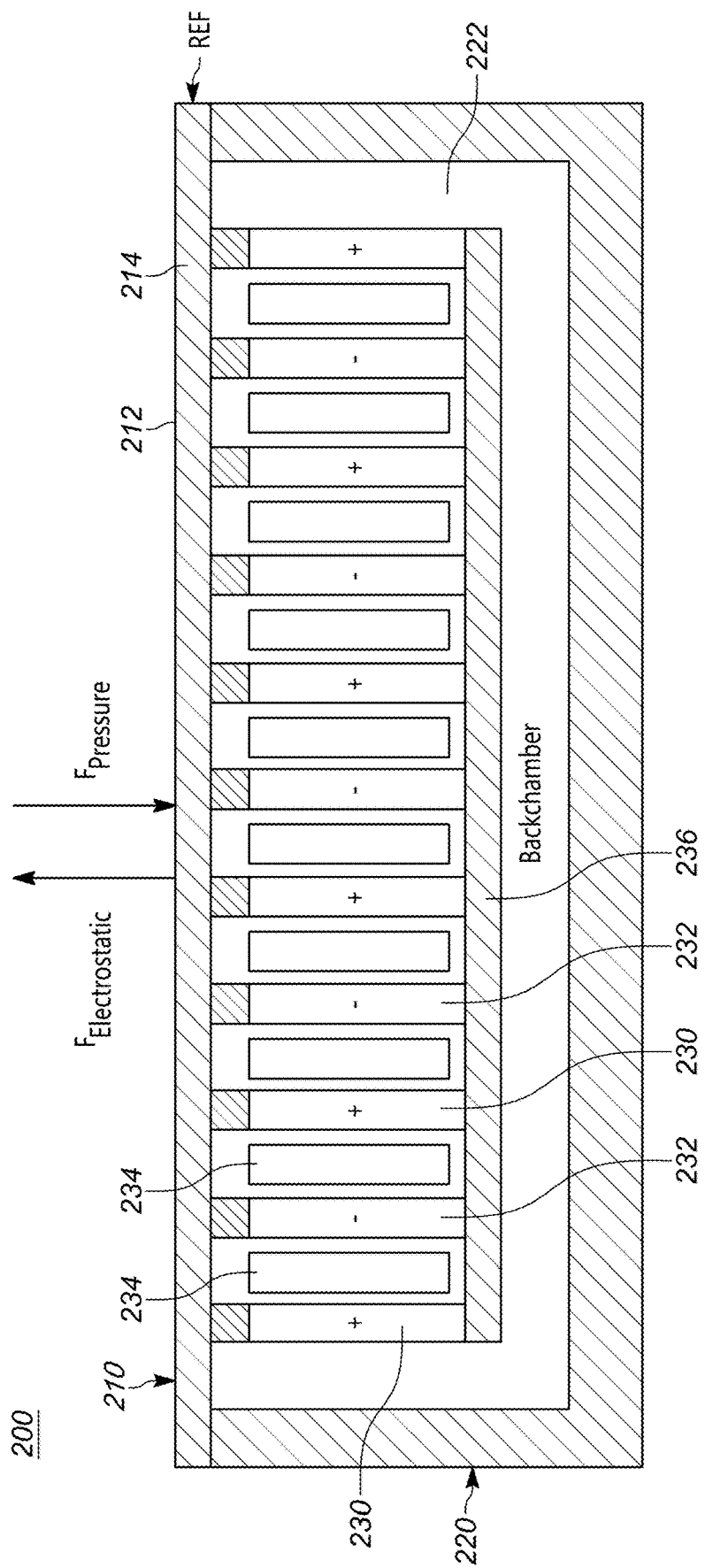
FIG. 2 is a sectional view of a representative transducer.
Figure 3:
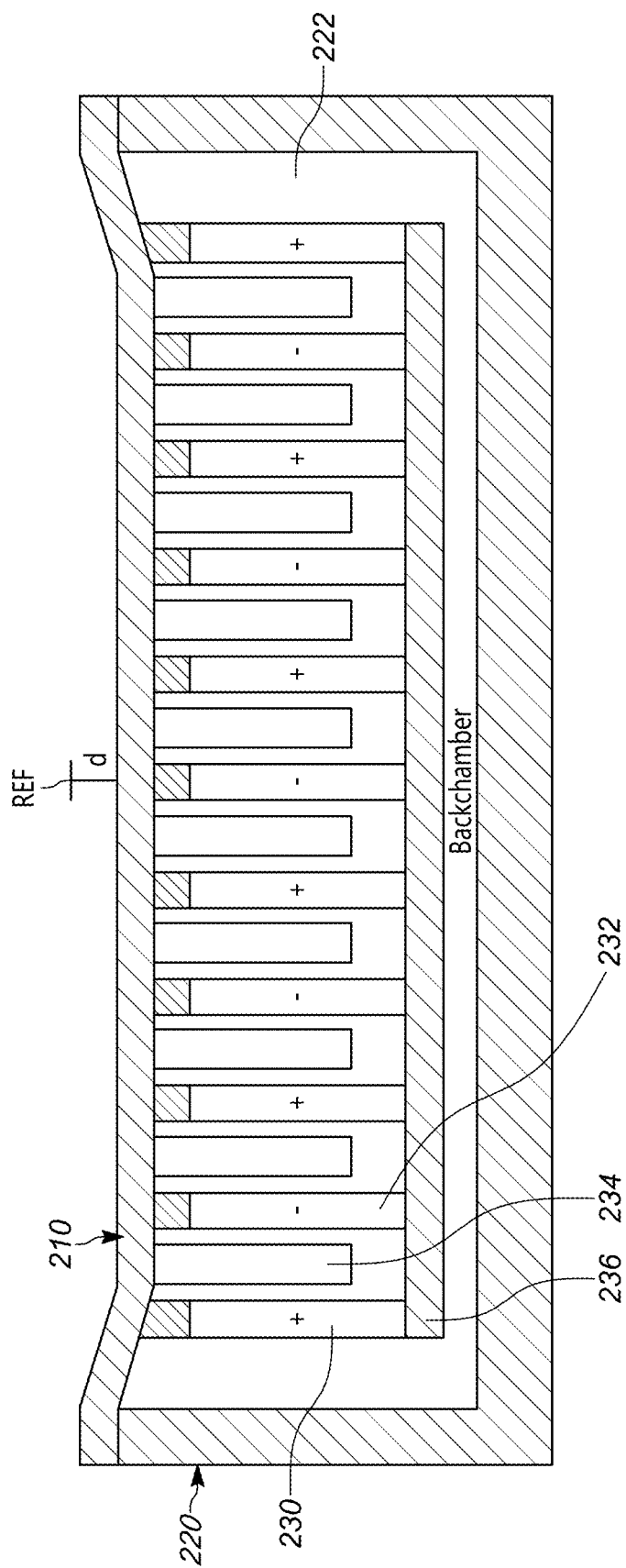
FIG. 3 is a sectional view showing the transducer of FIG. 2 actuated by a disturbance.

Representative transducer elements suitable for use in transducer assemblies of the types described herein include capacitive, piezoelectric and optical transducers among others. In sensor applications, the transducer generates an electrical signal in response to displacement of the movable member. In actuator applications, the transducer drives the movable member in response to an applied electrical signal. The transducer generally comprises one or more electrodes movable relative to one or more fixed electrodes or dielectrics. The electrodes can assume different structural forms including a diaphragm movable relative to a back plate, fixed and movable electrodes having interdigitated fingers, among others. A piezoelectric transducer generally comprises a movable member formed of or including a piezoelectric material. These and other transducers can be implemented as a microelectromechanical systems (MEMS) motor, among other known and future devices. Some transducers can include a sealed chamber at non-ambient pressure between the one or more movable members or electrodes and the one or more fixed elements or electrodes. The non-ambient pressure can be a partial or near-full vacuum. Alternatively, the non-ambient pressure can be greater than ambient pressure. These and other transducers can be devoid of a barometric relief vent. More specific, but non-limiting, representative examples of transducers are described further herein. FIGS. 2 and 3 illustrate a representative mechanism by which the transducer can be influenced by ambient pressure as described further herein. Other transducers with or without an evacuated or high pressure chamber can also be subject to ambient pressure and other disturbances that adversely affect performance.

FIGS. 2 and 3 illustrate a representative transducer influenced by ambient pressure and changes therein among other disturbances. The transducer 200 comprises a movable member implemented as a diaphragm 210 enclosing an interior volume of a housing 220. The diaphragm comprises a conductive portion 212 disposed on a dielectric portion 214 coupled to a plurality of conductors 230 and 232 in spaced apart relation. Neighboring conductors have an opposite charge polarity or voltage applied thereto by a bias circuit (not shown in FIGS. 2 and 3). A plurality of relatively fixed dielectric members 234 are interleaved between the plurality of conductors 230 and 232. A second dielectric member 236 is coupled to the conductors 230 and 232 opposite the dielectric diaphragm 210. The second dielectric member 236 can also have a conductive portion, depending on the transducer type. The interior volume forms a back chamber 222 having a pressure that can be lower (e.g., vacuum, near vacuum, etc.) or higher relative to the ambient pressure (e.g., barometric pressure) outside the back chamber. An electrostatic bias voltage applied to the conductors 230 and 232 positions the diaphragm relative to the fixed dielectric members 234. The diaphragm can be biased or positioned at a particular reference position, REF, by adjusting the voltage. Thus the positive and negative electrodes of the movable member are electrostatically biased relative to the dielectric member. Electrostatic interaction between the conductors 230 and 232 and the fixed dielectric members 234 re-positions the movable member upon displacement caused by a disturbance or by an electrical excitation signal.

In FIGS. 2 and 3, external disturbances and changes therein displace the movable member from its reference position. For example, barometric pressure can vary between 70 kPa and 120 kPa, which is a large variation compared to that of sound. In microphone applications, which require a relatively highly compliant diaphragm, barometric pressure can collapse the diaphragm. The force on the diaphragm from barometric pressure, or ambient pressure more generally, is offset by the electrostatic force due to the voltage applied by the bias circuit. Subsequent changes in ambient pressure can displace the diaphragm relative to the reference position, adversely affecting performance of the sensor or actuator. For example, the displacement caused by ambient pressure can adversely affect the signal-to-noise ratio (SNR), sensitivity, and distortion of the sensor output signal. FIG. 2 shows the diaphragm 210 positioned in a reference position REF and FIG. 3 shows the diaphragm 210 displaced a distance "d" from the reference position REF and into the interior back volume 222. The direction and magnitude of the displacement depends on whether the ambient pressure is greater or less than the pressure of the back volume and on the magnitude of the ambient pressure. Servo-loop control of the electrostatic force can counter displacement of the movable member caused by ambient pressure. The electrostatic force can also compensate for displacement of the movable member due to disturbances other than ambient pressure and changes therein. Various other transducers, with and without a chamber having an air pressure more or less than ambient pressure, comprising an electrostatically biased movable member that can be controlled to compensate for disturbance are also possible.

Figure 4:
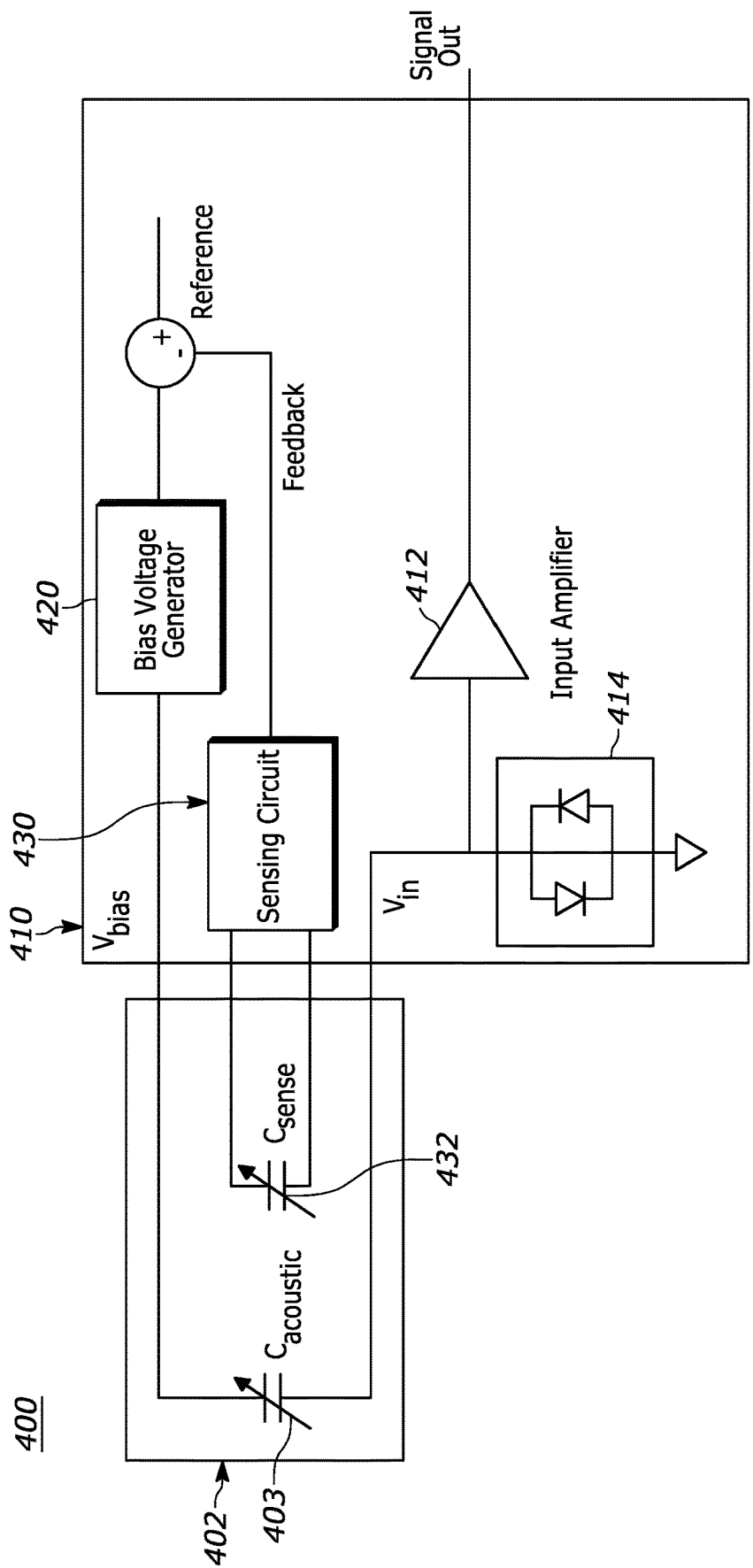
FIG. 4 is a block diagram of a transducer assembly.
Figure 7:
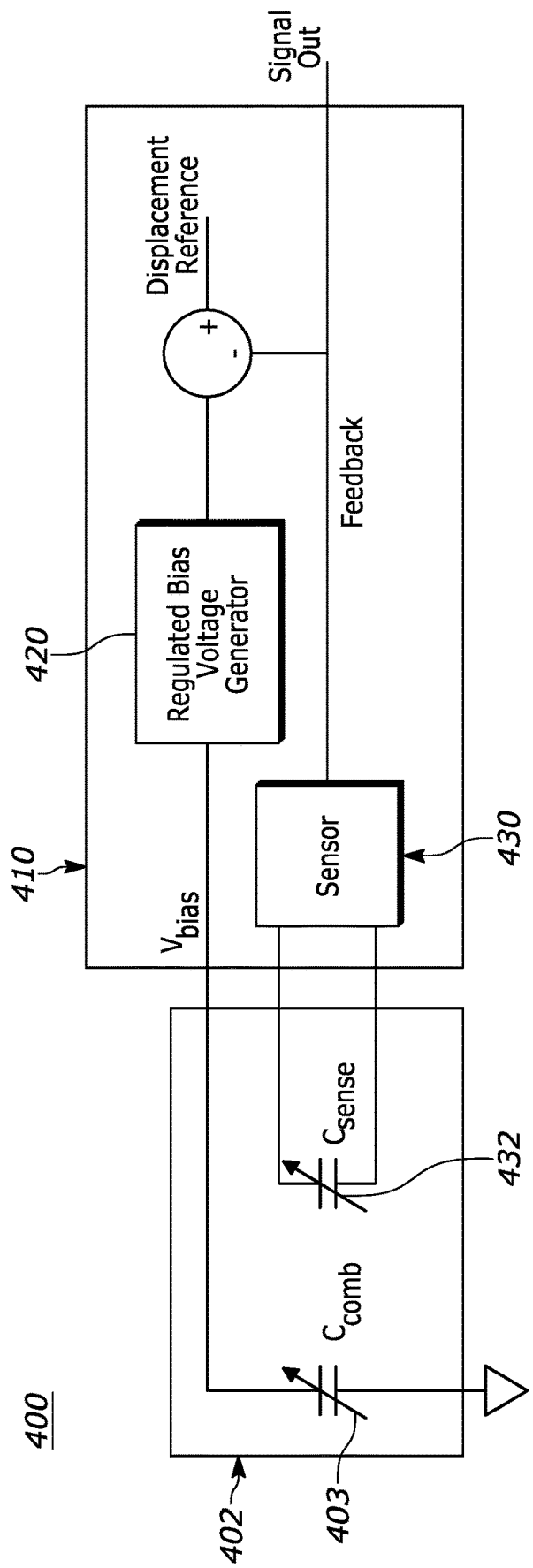
FIG. 7 is a block diagram of an alternative transducer assembly.

In FIGS. 4 and 7, the transducer assembly 400 generally comprises a transducer 402 (e.g., a MEMS motor) and an electrical circuit 410 (e.g., an ASIC). The transducer comprises a movable member or electrode 403. The electrical circuit comprises a regulated bias circuit 420 that generates an adjustable output voltage applied to the transducer, a position sensor 430 coupled to the transducer and configured to generate a feedback signal based on a position of the movable member, and a servo-loop controller coupled to the position sensor and to the bias circuit. The servo-loop controller is configured to suppress select frequency content of a disturbance by adjusting the output voltage of the bias circuit based on the feedback signal. The movable member of the transducer can be repositioned by adjusting the output voltage of the bias circuit. Such repositioning can offset displacement caused by a change in ambient pressure and other disturbances.

In FIGS. 4, 5, 6, 8 and 9, the output signal of the transducer assembly is based on a signal produced by the transducer wherein the output signal can be processed by a signal chain described further herein. In these implementations, the servo-loop controller can be configured to operate in different modes depending on the nature of the disturbance and required settling time. Settling time is generally a function of loop bandwidth measure from DC. Slower settling can be implemented where the frequency content of the disturbance is outside the desired bandwidth of the transducer assembly, for example to compensate for changes in ambient pressure. The loop bandwidth can be less than the lower cutoff frequency of the desired bandwidth where the frequency content of the disturbance is outside the desired bandwidth. Faster settling increases power consumption but may be appropriate for disturbances having frequency content within the desired bandwidth. For example, faster settling may be desired where the servo-loop controller compensates for transient disturbances like power ON, shock recovery, door slams, etc. The loop bandwidth can be greater than the lower cutoff frequency of the desired bandwidth where the frequency content of the disturbance is within the desired bandwidth or more generally where faster settling is desired.

In a representative MEMS microphone implementation having a desired bandwidth between 20 Hz and 20 kHz, the loop bandwidth can be less than 20 Hz to suppress frequency content below 20 Hz. A 1 Hz bandwidth or less (i.e., relatively slow settling) may be sufficient to compensate for changes in barometric pressure after startup. Faster settling may be required for some disturbances like start-up, door slams, wind noise and other disturbances. Generally, settling time can be reduced by increasing the loop bandwidth. A representative start-up operation of a MEMS microphone, during which a movable member of a MEMS transducer is biased into an operating position, can be on the order of 10 milliseconds, depending on the design of the transducer and other considerations. Depending on circuit implementation, a bandwidth on the order of 100 Hz or more may be required to achieve a 10 millisecond settling time and a 1 millisecond settling time can require a high bandwidth, for example, 1 kHz or more.

Figure 6:
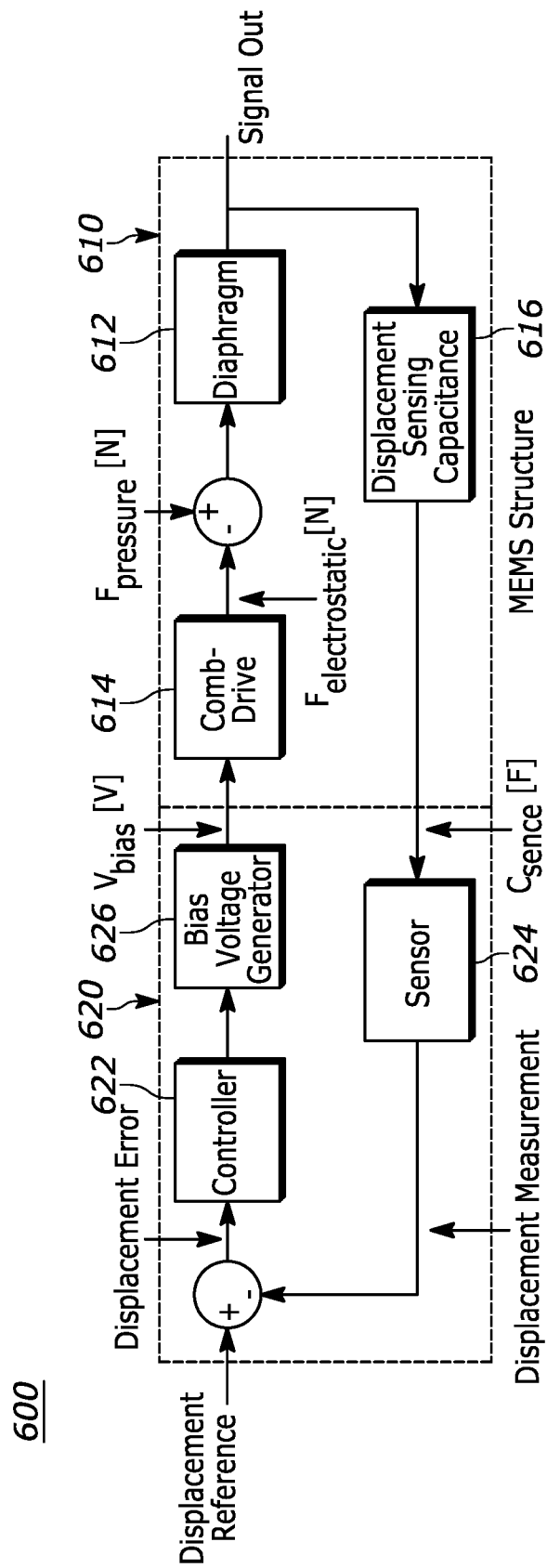
FIG. 6 is a more detailed block diagram of another transducer assembly.

In FIG. 6, a representative transducer assembly 600 comprises a transducer 610 coupled to an electrical circuit including a servo-loop control circuit 620. The transducer (e.g., a MEMS motor) comprises a diaphragm or other movable member 612 and an electrostatic comb-drive 614. The servo-loop control circuit comprises a controller 622 having an input coupled to a position sensor circuit 624 and an output coupled to a bias circuit 626 for regulating the output voltage of the bias circuit using a control signal. In some implementations, the position sensor 624 can include a displacement sensing capacitor 616 located to charge in dependence on the position of the movable member as described herein. The control signal from the controller 622 is based on a displacement error signal obtained as a difference between a reference signal and displacement measurement (i.e., feedback signal) from the position sensor. The reference signal can be calibrated for a particular configuration of the transducer (e.g., a position of the movable member relative to a reference position). Frequency content associated with the disturbance (e.g., wind and low frequency noise, etc.) can be managed (e.g., suppressed) by adjusting the bias voltage applied to the transducer. The bias voltage can also counter or offset displacement of the diaphragm or other movable member 612 caused by certain disturbances like changes in ambient pressure.

Figure 10:
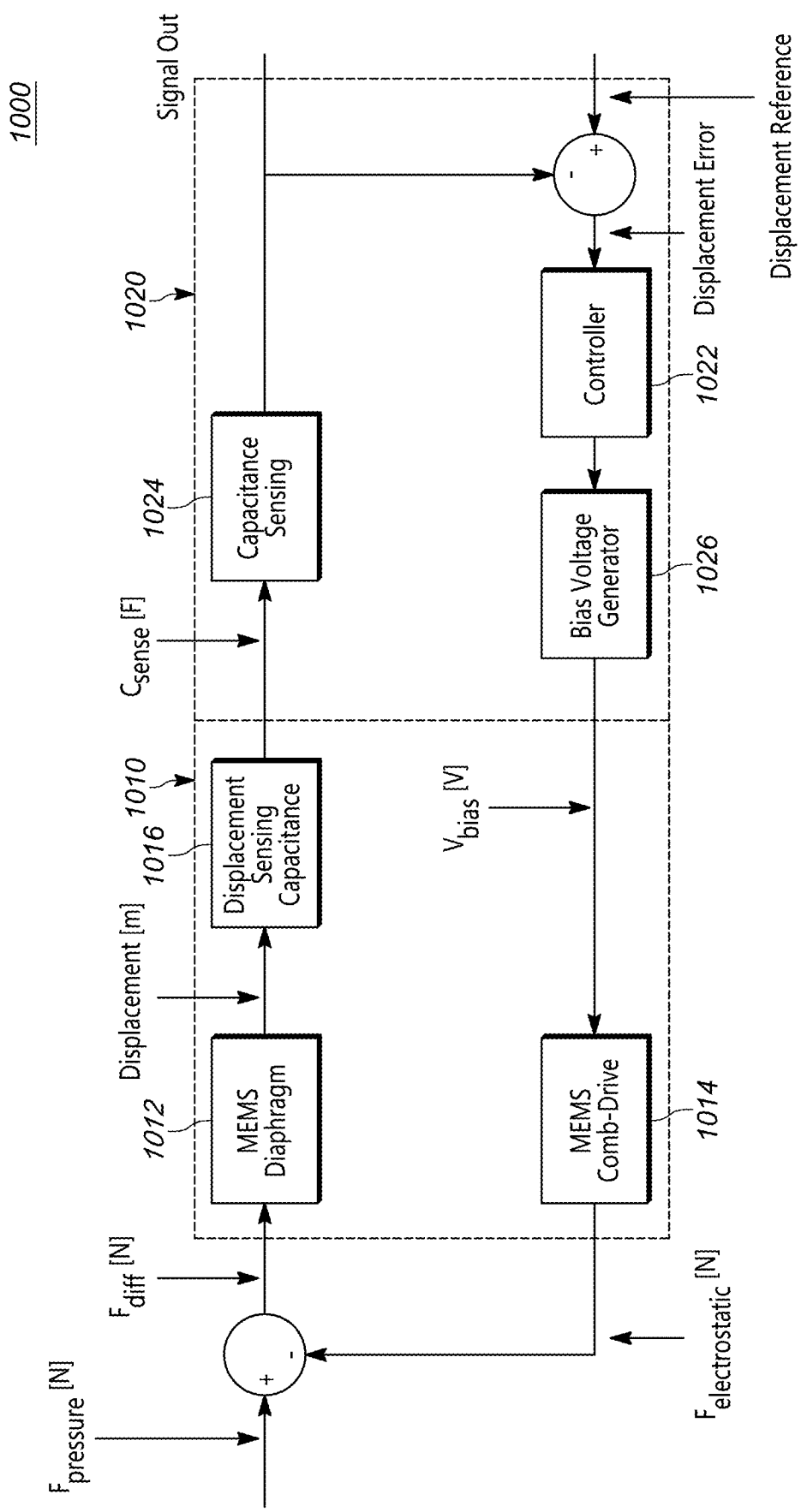
FIG. 10 is a more detailed block diagram of the alternative transducer assembly of FIG. 7.

In FIG. 7, the output signal of the transducer assembly is based on a signal obtained from the servo-loop, rather than directly from the transducer, and the servo-loop controller operates at a fixed bandwidth that exceeds the desired bandwidth of the transducer assembly. For example, the output signal can be based on the position sensor or the difference signal. Here too, the output signal can be further processed by a signal chain prior to output from the transducer assembly. In FIG. 10, a representative transducer assembly 1000 comprises a transducer 1010 coupled to an electrical circuit including a servo-loop control circuit 1020. The transducer (e.g., a MEMS motor) comprises a diaphragm or other movable member 1012 and an electrostatic comb-drive 1014. A bias voltage applied to the comb drive can counter or offset displacement of the diaphragm or other movable member caused by a disturbance. The servo-loop control circuit comprises a controller 1022 having an input coupled to a position sensor 1024 and an output coupled to a bias circuit 1026. In some implementations, the position sensor can include a displacement sensing capacitor 1016 located to charge in dependence on the position of the movable member as described herein. The control signal from the controller 1022 is based on a displacement error signal obtained as a difference between a reference signal and displacement measurement from the position sensor. As discussed, the reference signal can be calibrated for a particular position of the movable member relative to a reference position or selected based on some other performance criteria of the transducer assembly.

Figure 11:
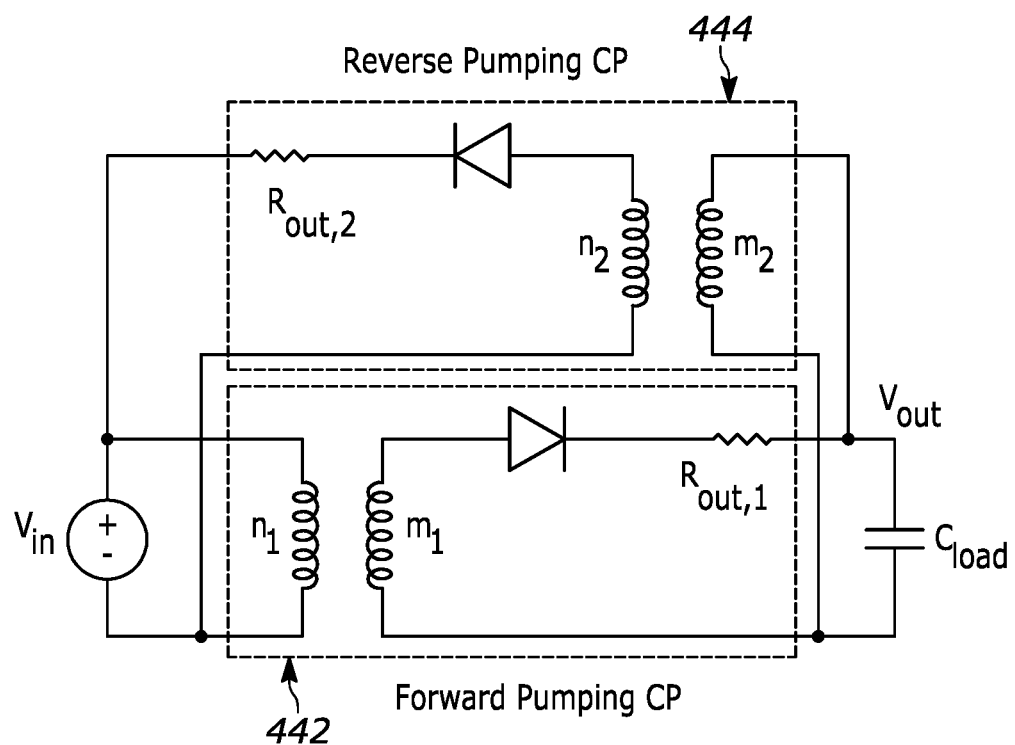
FIG. 11 is a block diagram of a bidirectional charge pump having reverse and forward charge pumps.
Figure 12:
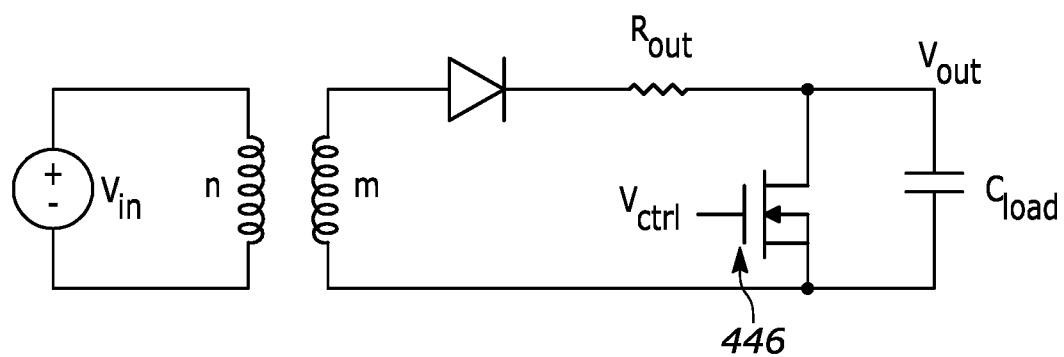
FIG. 12 is a block diagram of another bidirectional charge pump implemented using a transistor.

The bias circuit comprises a charge pump that supports bidirectional flow of charge to and from the transduction element, wherein the output voltage of the bias circuit is increased or decreased based on the feedback signal as described further herein. The bidirectional charge pump can be based on various topologies. In FIG. 11, a representative bidirectional charge pump 440 comprises a forward pumping charge pump (CP) 442 arranged in parallel with a reverse pumping CP 444. The forward pumping CP is configured to increase the output voltage and the reverse pumping CP is configured to decrease the output voltage, depending on the nature of the disturbance (e.g., whether more or less electrostatic force is required to compensate for displacement of the movable member). Alternatives to a parallel arrangement of forward and reverse charge pumps include use of a discharge transistor or Class A, B, or AB amplifiers with a unidirectional charge pump. In FIG. 12, for example, the bidirectional charge pump includes a discharge transistor 446 at the output stage for reducing voltage applied to the transducer. However discharge transistors may require a more complex control scheme and amplifiers can consume significant power when used to bias MEMS motors that require high voltages.

Generally, the charge pump can be a single-stage or multi-stage device having an output voltage that varies as a function of the servo-loop feedback signal. A relatively large force can be required to compensate for the effects of some disturbances (e.g., barometric pressure, door slams, etc.) on the transducer assembly. Thus a relatively high voltage can be required to provide the necessary electrostatic force on the movable member of the transducer. In a transducer implementation of the type show in FIGS. 2 and 3, a voltage as high as 200 V or more may be required to compensate for some disturbances. However these representative voltages are non-limiting and can be more or less depending on the architecture of the transducer, the nature of the disturbance and other considerations.

High bias voltages can be generated efficiently by a bias circuit comprising a multi-stage charge pump. In the system 500 of FIG. 5, the bias circuit 510 comprises a two-stage charge pump including a relatively low voltage input stage 512 and a relatively high voltage last or final stage 514. The input stage 512 provides a variable output voltage to a downstream stage based on a variable reference signal (e.g., a control signal) applied to an input of the input stage. The variable reference signal is based on the position of the movable member of the transducer as described further herein. The input stage 512 provides a variable output voltage to the final stage 514, which provides a variable DC voltage to the transducer. More generally, the input stage can provide the variable DC output voltage to one or intermediate stages that, in turn, provide a variable voltage to a subsequent stage leading up to the final stage. The bias circuit generally comprises a filter circuit (not shown) at the output of the final charge pump stage.

Figure 5:
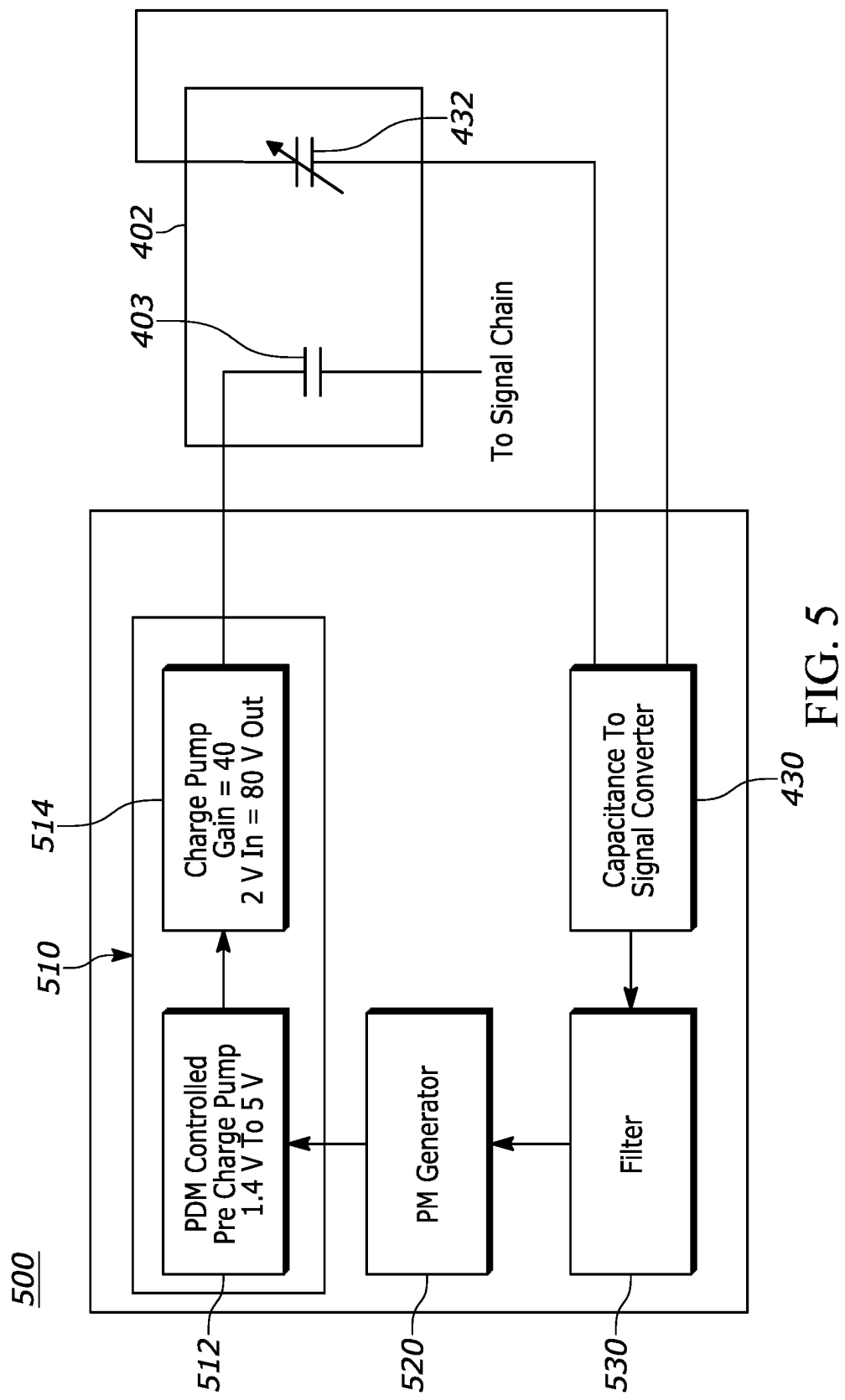
FIG. 5 is a block diagram of another transducer assembly.

In FIG. 5, the gain of the input charge pump stage 512 can be less than the gain of the final stage charge pump 514. In one implementation, the initial stage has a gain of about five (5) and the final stage charge pump has a gain of about forty (40). However the representative gains and output voltages described herein are non-limiting. The voltage output by the bias circuit can be as low as 1 V or less and as high as 200 V or more, depending on the transducer design and the application requirements. Intermediate stages may be required for higher voltages.

In some implementations, an output impedance of the final stage of the bias circuit is relatively high compared to the output impedance of the input stage. Such a high impedance final stage is generally required for interfacing with transducers that require a fixed charge, among others. For example, the load resistance of a capacitive MEMS motor can be as high as 15 T$\Omega$. Other transducers may have more or less load impedance. Thus in other implementations, the bias circuit need not have such a high output impedance. In some multi-stage charge pump implementations, the first charge pump stage has a relatively low output voltage and a relatively low output impedance, and the final charge pump stage has a relatively high output voltage and a relatively high output impedance.

Figure 8:
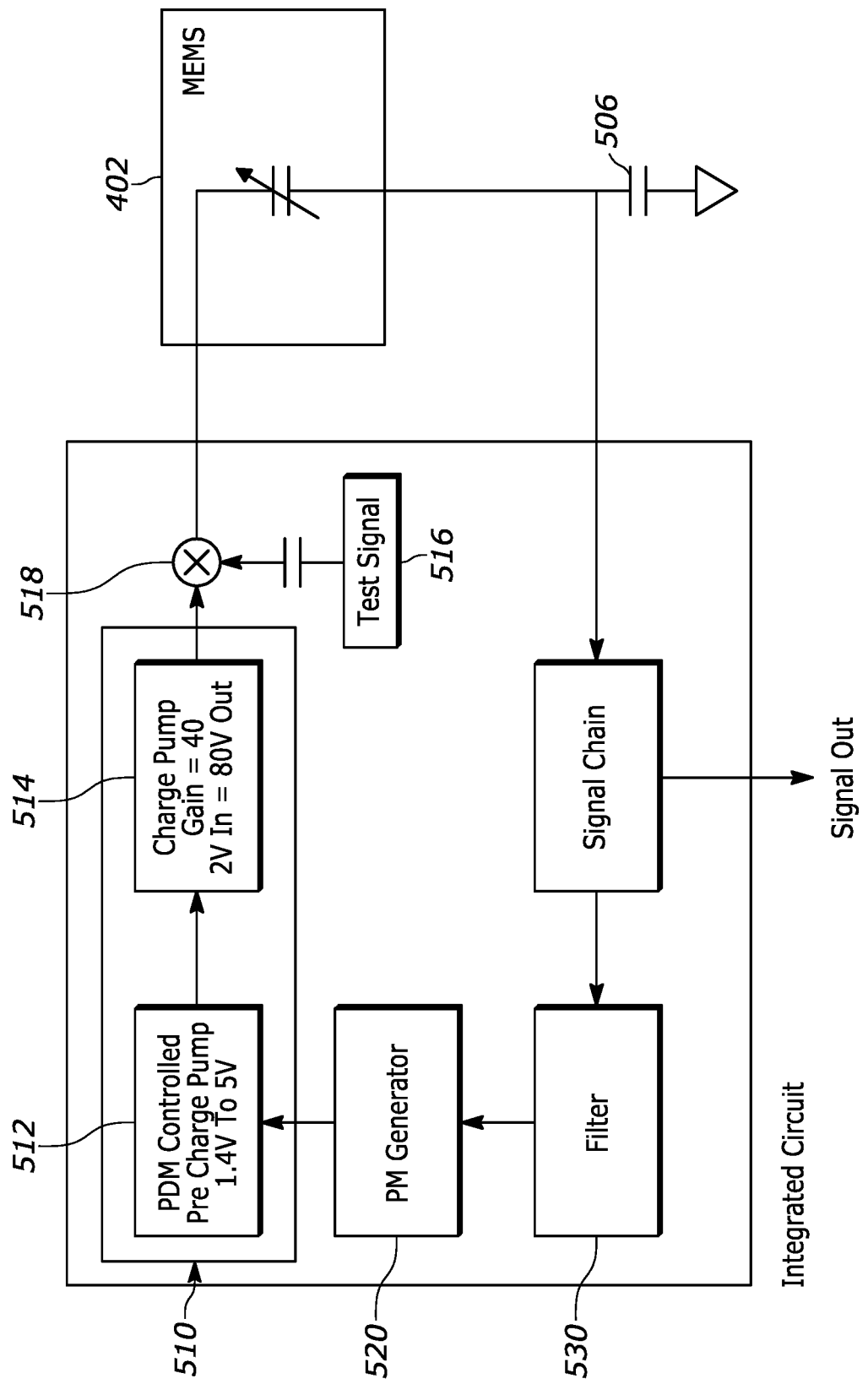
FIG. 8 is a block diagram of another transducer assembly.

Generally, the controller is configured to generate a control or reference signal based on the feedback signal from the position sensor and to provide the control signal to the bias circuit, wherein the output of the bias circuit is based on the control signal. In a digital implementation, the controller comprises a filter and a pulse modulation (PM) signal generator configured to generate a PM control signal based on an analog or digital feedback signal. The filter configures the loop bandwidth to achieve system dynamics through adaptive and selective frequency filtering and other behavior. In FIGS. 5 and 8, the servo-loop controller includes a filter 530 in the feedback loop for this purpose. The filter can be high frequency filter, a bandpass filter or a non-linear filter among others.

PM modulation can include pulse number modulation (PNM), pulse density modulation (PDM), pulse amplitude modulation (PAM), or pulse width modulation (PWM). In FIGS. 5 and 8, a PM generator 520 provides the PM control signal to the first charge pump stage 512. The first charge pump stage generates a variable output voltage based on a characteristic (e.g., frequency, pulse width . . . ) of PM pulses. The variable output voltage of the first stage in turn controls the variable output voltage of a subsequent downstream charge pump stage. According to this representative implementation, the adjustable output voltage of the bias circuit is based on the PM control signal. The PM control signal can be generated by a variety of different circuits, including a voltage-controlled oscillator (VCO), clock divider, or delta-sigma modulator, among others. A PM controller is suitable for digital applications that require relatively high resolution control.

Figure 13:
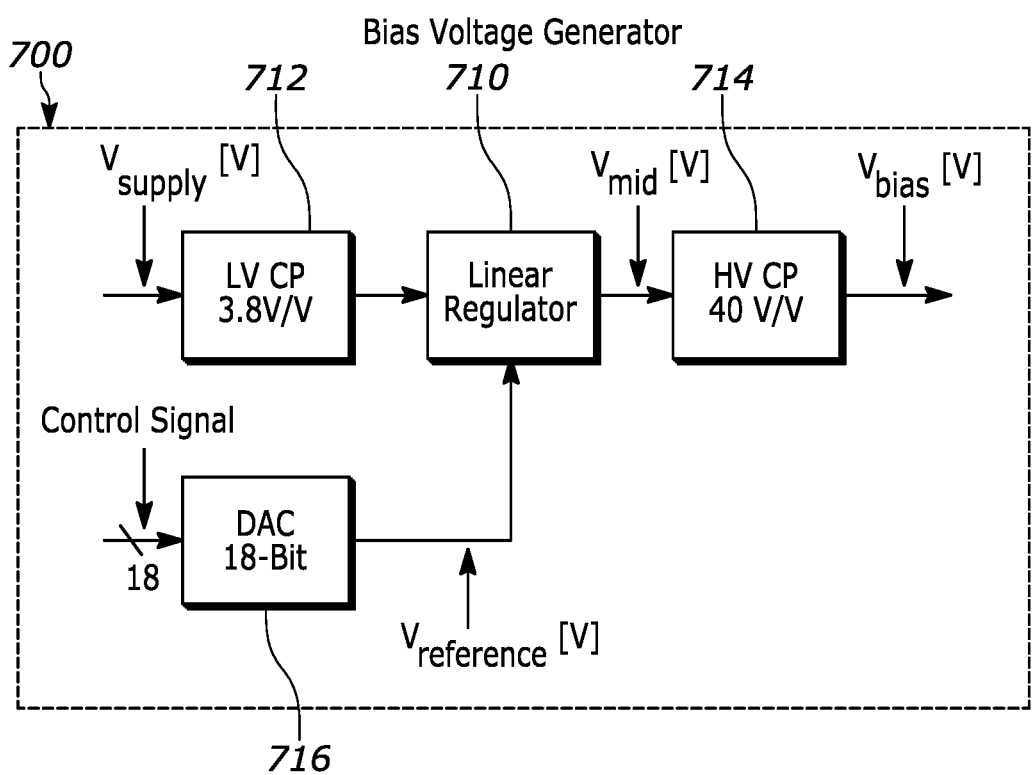
FIG. 13 is a block diagram of a multi-stage charge pump.

In an alternative implementation, a digital-to-analog converter (DAC) converts a digital control signal to an analog reference signal that controls a linear regulator. In FIG. 13, a bias circuit 700 comprises a linear regulator 710 located between a low voltage (LV) CP 712 and a high voltage (HV) CP 714. The linear regulator is driven by a reference voltage from a DAC 716, wherein the output voltage of the HV CP is based on the reference signal.

Figure 14:
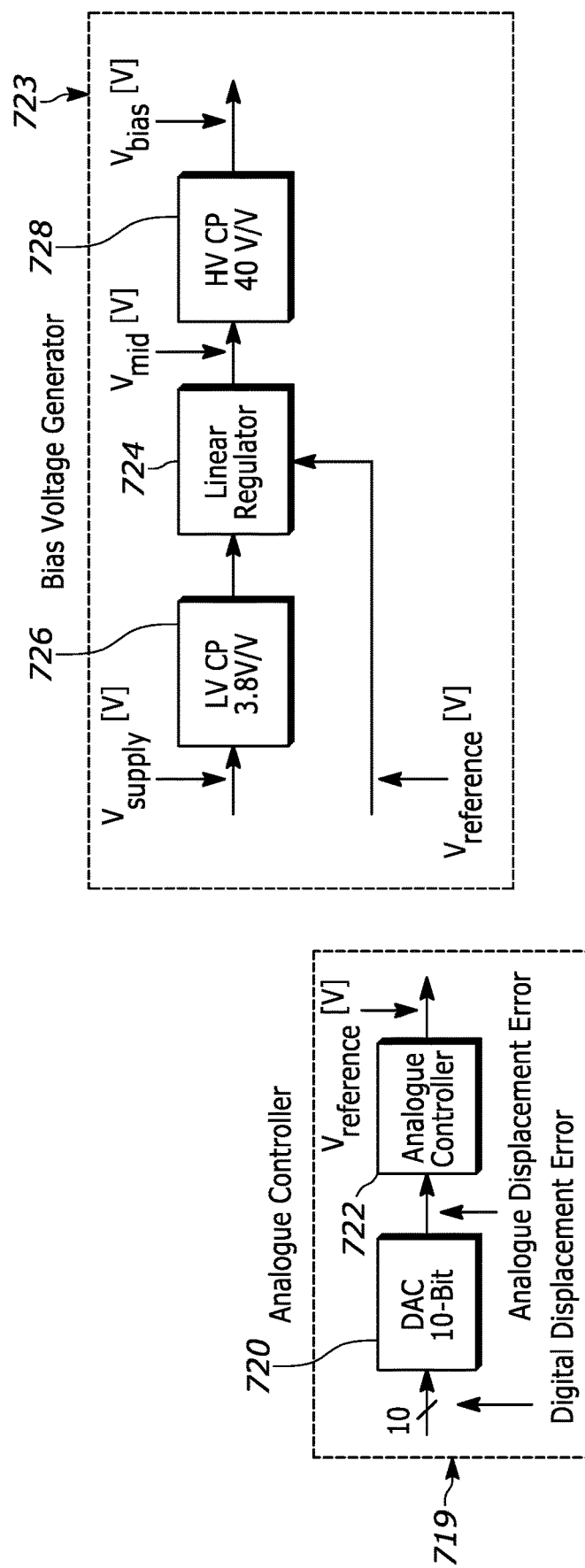
FIG. 14 is a block diagram of another multi-stage charge pump.

In another alternative implementation shown in FIG. 14, a controller 719 comprises a DAC 720 that converts a digital error signal to an analog error signal, and an analog controller 722 provides a reference signal to a linear regulator 724 of the bias circuit 723. The linear regulator is located between a low voltage CP 726 and a high voltage CP 728 as described above in connection with FIG. 13.

Figure 15:
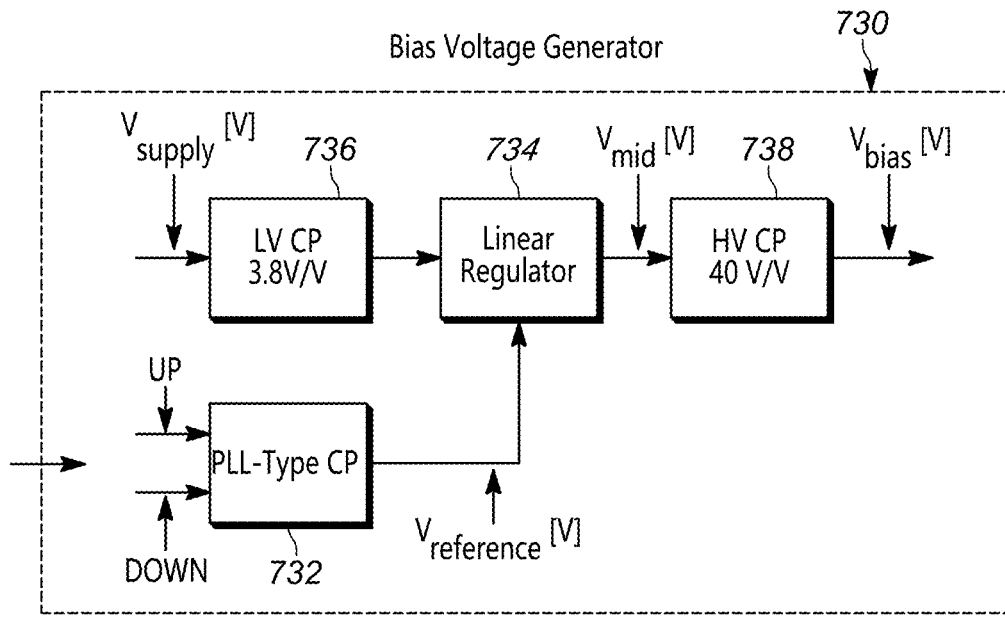
FIG. 15 is a block diagram of another multi-stage charge pump.
Figure 16:
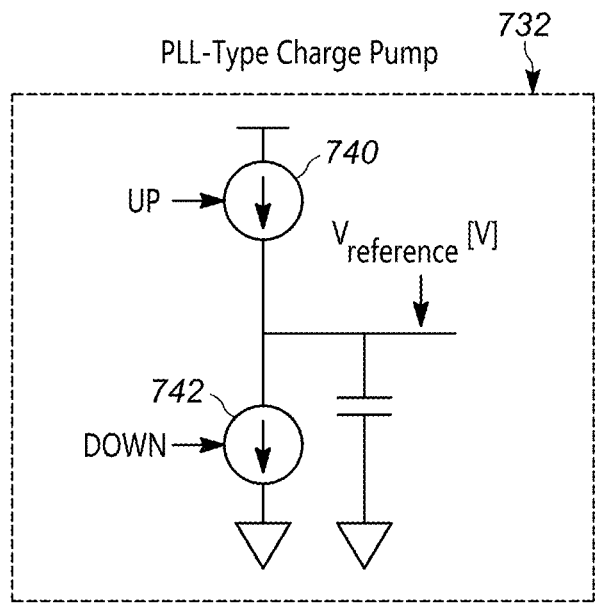
FIG. 16 is a block diagram of a PLL-type charge pump.

In the bias circuit 730 of FIG. 15, a PLL-type charge pump 732 generates the reference signal applied to a linear regulator 734 located between a low voltage CP 736 and a high voltage CP 738 as described above in connection with FIG. 13. In FIG. 16, the PLL-type charge pump 732 comprises UP and DOWN current sources 740, 742 driven by corresponding UP and DOWN drive signals from the controller. The circuit implementation of FIGS. 15 and 16 eliminate the requirement for a DAC.

The position sensor of the servo-loop controller is generally configured to generate a feedback signal (also referred to as a "displacement measurement") based on a response of the transducer to a disturbance. The response can be a change in position of the movable member of the transducer or a measurable electrical metric. In FIGS. 4, 5 and 7, the position sensor 430 comprises a sense capacitor 432 positioned proximate to the movable member of the transducer 402 and configured to accumulate charge in proportion to the position (e.g., displacement) of the movable member. The position sensor 430 further comprises an electrical circuit (e.g., a capacitance-to-signal converter) that converts charge on the sense capacitor to the feedback signal. The feedback signal can be an analog current, voltage or charge signal or a digital signal. In one implementation, the capacitance-to-signal converter is an analog-to-digital (ADC) sensor that converts the capacitance of the sense capacitor to a digital feedback signal. Alternatively, other circuits can be used to generate the feedback signal in digital or analog form.

In one implementation, the sense capacitor is integrated with a MEMS motor wherein the sense capacitor comprises an electrode coupled to the movable member. The capacitance of the sense capacitor can be an order of magnitude less than the capacitance of a capacitive transducer, more or less. A non-limiting representative MEMS motor has a capacitance on the order of 10 pF and an integrated sense capacitor having a capacitance on the order of 1 pF.

Figure 9:
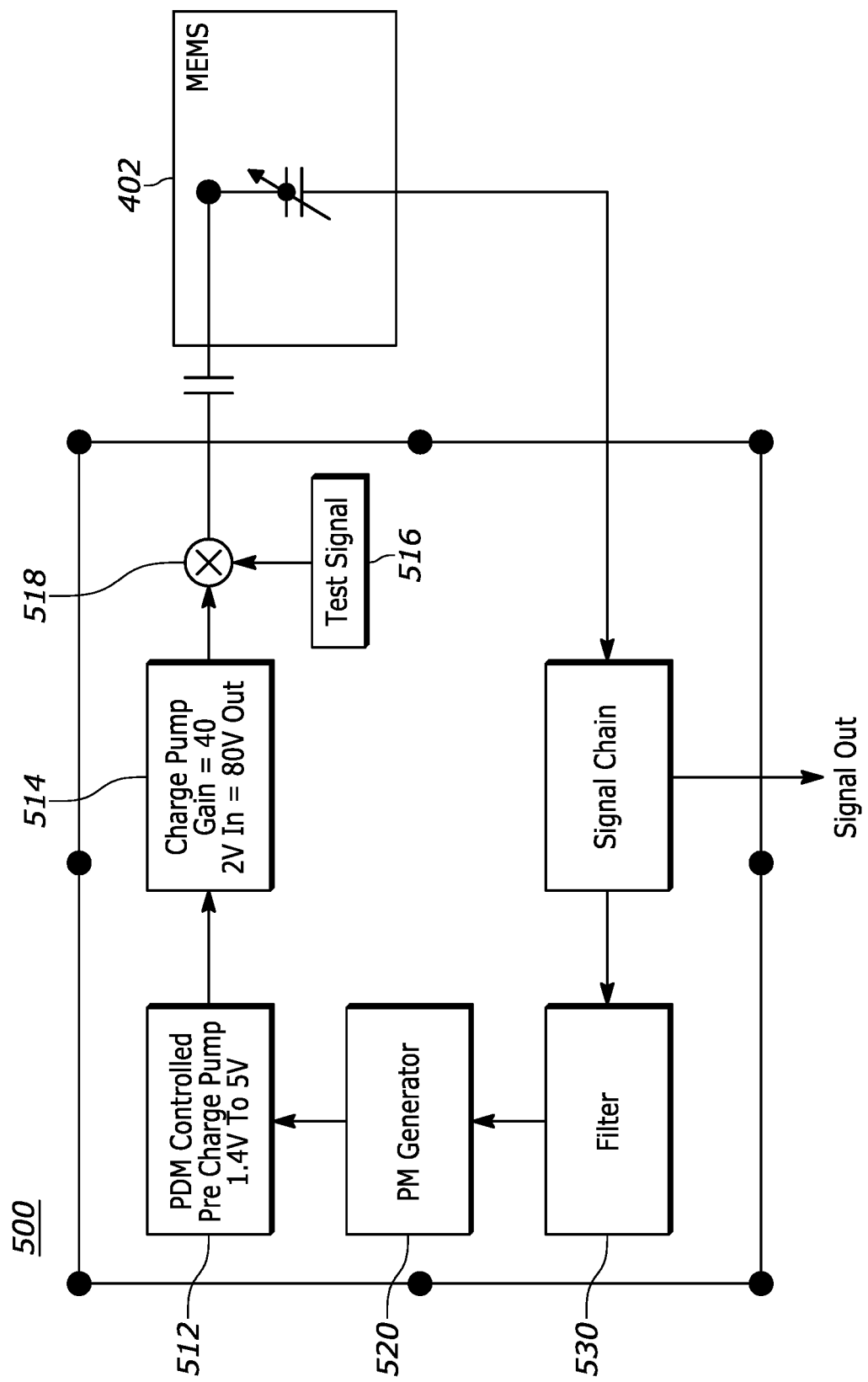
FIG. 9 is a block diagram of another transducer assembly.

Alternatively, the position of the movable member can be determined by applying an AC test signal to the transducer, without the need for the sense capacitor. The test signal can have a frequency higher than an upper frequency of the characteristic bandwidth and the test signal generator can be isolated from the transducer by a blocking capacitor. Application of the AC test signal can be performed intermittently and the position measurement can be performed by the sensor circuit or some other circuit when the AC test signal is applied. In these implementations, the position of the movable member can be determined based on either a voltage or current measurement associated with the test signal. In FIGS. 8 and 9, the electrical circuit comprises an AC test signal generator 516 that applies the test signal to the transducer 402 via a feed 518. In FIG. 8, the position of the movable member is proportional to a voltage measured at a voltage divider circuit formed by the capacitive transducer 402 and capacitor 506 when the test signal is applied. In FIG. 9, the position of the movable member is proportional to a measure of current to or from the transducer when the AC test signal is applied. In FIG. 9, the current measurement can be performed without the need for a voltage divider capacitor 506 of FIG. 8.

In some sensor implementations, the transducer assembly comprises a signal processing chain configured to condition an electrical signal prior to outputting the conditioned signal at an output (e.g., a host-interface) of the transducer assembly. In FIGS. 4, 5, 6, 8 and 9, the signal processing chain obtains and processes a signal from the transducer. In FIGS. 7 and 10, the signal processing chain obtains and processes a signal from the servo-loop as described herein. The signal processing chain can include any one or more of a filter, buffer, amplifier, charge sampling circuit, analog-to-digital converter (ADC), signal protocol circuit, among other signal conditioning circuits. In FIG. 4, the electrical circuit 410 comprises a low noise amplifier (LNA) 412 having a high resistance element 414 at an input coupled to the capacitive transducer 402. The high resistance element can be implemented as a parallel arrangement of counter-orientated parallel diodes. An output of the amplifier is coupled directly or indirectly to the host interface of the transducer assembly. Other signal conditioning circuit elements can also be included in combination with, or in lieu of, the LNA, examples of which are described herein.

Figure 17:
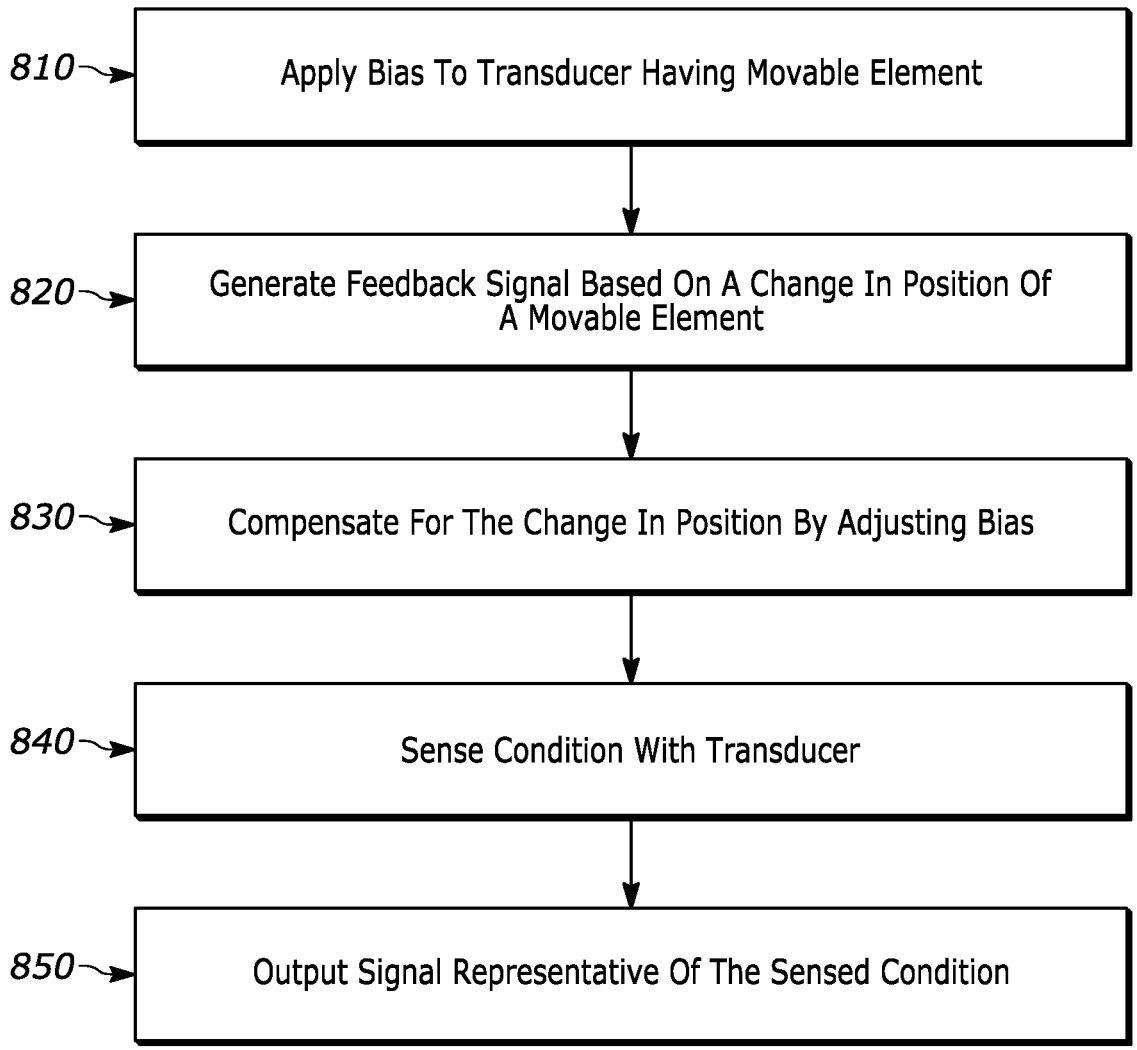
FIG. 17 is a block flow diagram.

In the process 800 depicted in FIG. 17, at 810, a bias voltage is applied to a transducer (e.g., a MEMS motor) having a movable member. The transducer can be part of a transducer assembly implemented as a sensor or an actuator. At 820, a feedback signal is generated based on a mechanical or electrical response of the transducer to a disturbance, examples of which are described herein. At 830, the disturbance on the transducer assembly is compensated by adjusting the bias voltage applied to the transducer based on the feedback signal using a servo-loop controller having a bandwidth dependent on whether the disturbance has in-band or out-of-band frequency content. At 840, the sensor senses a condition like sound, pressure acceleration, and temperature among others. An output of the sensor is representative of the sensed condition at 850. The signal representative of the sensed condition can be based on an analog signal generated by the transduction element after compensating for the effect of the ambient pressure.

While the disclosure and what is presently considered to be the best mode thereof has been described in a manner establishing possession and enabling those of ordinary skill in the art to make and use the same, it will be understood and appreciated that there are many equivalents to the select embodiments described herein and that myriad modifications and variations may be made thereto without departing from the scope and spirit of the invention, which is to be limited not by the embodiments described herein but by the appended claims and their equivalents.

What is claimed is:
1. A transducer assembly comprising:
   a transduction element comprising a movable member, the transduction element configured to produce a mechanical output in response to an excitation signal or produce an electrical signal in response to actuation of the movable member;
   a bias circuit having an adjustable output voltage coupled to the transduction element;
   a sensor coupled to the transduction element and configured to generate a feedback signal in response to a disturbance on the transduction element;
   a servo-loop controller coupled to the sensor and to the bias circuit, the servo-loop controller configured to selectively suppresses frequency content associated with the disturbance by regulating the output voltage of the bias circuit based on the feedback signal;
   wherein the bias circuit comprises a bidirectional charge pump configured to increase or decrease the output voltage of the bias circuit.
2. The transducer assembly of claim 1, wherein the bidirectional charge pump is configured to increase or decrease the output voltage of the bias circuit based upon the feedback signal, which affects a value of a charge being applied to the transduction element by the bias circuit.

3. The transducer assembly of claim 2, the servo-loop controller further comprising a loop filter having an input coupled to the sensor and an output coupled to the bias circuit, the servo-loop controller configured to generate a control signal based on the feedback signal, wherein the output voltage of the bias circuit is based on the control signal.

4. The transducer assembly of claim 3 further comprising a signal processing path having an input coupled to an output of the transduction element, the signal processing path having an output coupled to an external interface of the transducer assembly, wherein the servo-loop controller comprises a loop bandwidth less than a lower frequency of the desired bandwidth.

5. The transducer assembly of claim 4, wherein the servo-loop controller comprises a loop bandwidth greater than the lower frequency of the desired bandwidth during transient disturbances having frequency content within the desired bandwidth.

6. The transducer assembly of claim 3, wherein a bandwidth of the servo-loop controller is adaptable for faster or slower settlement based on a characteristic of the disturbance.

7. The transducer assembly of claim 3, wherein the servo-loop controller has a slow settling time for disturbances having a bandwidth outside the desired bandwidth and a fast settling time for disturbances with frequency content within the desired bandwidth.

8. The transducer assembly of claim 1, the sensor comprising a capacitor configured to accumulate charge based on charge on the transduction element, wherein the feedback signal is based on the charge on the capacitor.

9. The transducer assembly of claim 1, the sensor is configured to generate the feedback signal based on application of a test signal to the transduction element, wherein the test signal has a frequency higher than the desired bandwidth.

10. The transducer assembly of claim 1 further comprising a signal processing path configured to provide an output signal, based on the feedback signal, to an external interface wherein the servo-loop controller comprises a loop bandwidth greater than the desired bandwidth of the transducer assembly.

11. A transducer assembly comprising:
a housing having an external interface;
a microelectromechanical systems (MEMS) motor disposed in the housing and comprising a movable member, the MEMS motor devoid of a barometric pressure relief vent and configured to produce a mechanical output in response to an excitation signal or produce an electrical signal in response to movement of the movable member;
a bias circuit having an adjustable output voltage coupled to the MEMS motor;
a sensor coupled to the MEMS motor and configured to generate a feedback signal based on an effect of a disturbance on the transducer assembly having frequency content inside or outside a desired bandwidth of the transducer assembly;
a servo-loop controller coupled to the sensor and to the bias circuit, the servo-loop controller configured to compensate for the disturbance by adjusting the output voltage of the bias circuit based on the feedback signal;
wherein the bias circuit comprises a multistage charge pump configured to provide bidirectional flow of charge to and from the MEMS motor, and wherein the output voltage of the bias circuit is increased or decreased based on the feedback signal.

12. The transducer assembly of claim 11, the servo-loop controller further comprising a Pulse Modulation (PM) signal generator having an input coupled to the sensor and an output coupled to the multistage charge pump, the PM signal generator configured to generate a PM control signal based on the feedback signal and provide the PM control signal to a first stage of the multistage charge pump, wherein the adjustable output voltage of the bias circuit is based on the PM control signal.

13. The transducer assembly of claim 12, wherein the first stage of the multistage charge pump has a low output impedance relative to an output impedance of a last stage of the multistage charge pump, and the first stage of the multistage charge pump has a low output voltage relative to an output voltage of the last stage of the multistage charge pump, the output voltage of the last stage greater than 50 V.

14. The transducer assembly of claim 11, wherein the servo-loop controller comprises a longer settling time for disturbances having a bandwidth outside the desired bandwidth than for disturbances having frequency content within the desired bandwidth.

15. The transducer assembly of claim 11 is a microphone and the movable member of the MEMS motor comprises positive and negative electrodes electrostatically biased relative to a dielectric member located between the positive and negative electrodes.

16. The transducer assembly of claim 15 further comprising a signal processing path having an input coupled to the MEMS motor, the signal processing path having an output coupled to the external interface, wherein the servo-loop controller comprises a loop bandwidth less than a low cutoff frequency the desired bandwidth.

17. The transducer assembly of claim 16, wherein the servo-loop controller comprises a loop bandwidth greater than the low cutoff frequency of the desired bandwidth during transient disturbances.

18. The transducer assembly of claim 15, wherein the servo-loop controller comprises a loop bandwidth less than 1 Hz for disturbances having a bandwidth outside the desired bandwidth and the servo-loop controller comprises a loop bandwidth greater than 100 Hz for transient disturbances.

19. The transducer assembly of claim 18, wherein the sensor comprises a capacitor integrated with the MEMS motor and configured to detect displacement of the movable member by the disturbance, the feedback signal is based on charge on the capacitor, wherein the servo-loop controller is configured to reposition the movable member relative to a reference position by adjusting the output voltage of the bias circuit based on the feedback signal.

20. A transducer assembly comprising:
a transduction element comprising a movable member, the transduction element configured to produce a mechanical output in response to an excitation signal or produce an electrical signal in response to actuation of the movable member;
a bias circuit having an adjustable output voltage coupled to the transduction element;
a sensor coupled to the transduction element and configured to generate a feedback signal in response to a disturbance on the transduction element;
a servo-loop controller coupled to the sensor and to the bias circuit, the servo-loop controller configured to selectively suppresses frequency content associated with the disturbance by regulating the output voltage of the bias circuit based on the feedback signal;

a signal processing path configured to provide an output signal, based on the feedback signal, to an external interface wherein the servo-loop controller comprises a loop bandwidth greater than the desired bandwidth of the transducer assembly.

\* \* \* \* \*